United States Patent [19]

Vieilledent

[11] Patent Number: 4,701,236
[45] Date of Patent: Oct. 20, 1987

[54] METHOD OF MANUFACTURING AN ELECTRONIC IDENTIFICATION CARD

[75] Inventor: Gérard Vieilledent, Grossoeuvre, France

[73] Assignee: U.S. Philips Corporation, New York, N.Y.

[21] Appl. No.: 847,987

[22] Filed: Apr. 3, 1986

[30] Foreign Application Priority Data

Apr. 12, 1985 [FR] France .................... 8505518

[51] Int. Cl.[4] .................. B32B 31/04; B32B 31/08; B32B 31/10; B32B 31/12
[52] U.S. Cl. .................. 156/252; 156/253; 156/261; 156/289; 156/297; 283/904; 427/195; 427/282; 427/384
[58] Field of Search .............. 156/252, 253, 261, 289, 156/297; 427/179, 195, 282, 384; 283/904

[56] References Cited

U.S. PATENT DOCUMENTS

| | | | |
|---|---|---|---|
| 3,689,991 | 9/1972 | Aird | 29/577 |
| 4,150,211 | 4/1979 | Muller et al. | 427/195 |
| 4,360,559 | 11/1982 | Dalencon | 427/282 |
| 4,463,971 | 8/1984 | Hoppe et al. | 283/83 |
| 4,474,292 | 10/1984 | Haghiri-Tehrani | 206/329 |
| 4,483,067 | 11/1984 | Parmentier | 29/890 |
| 4,552,383 | 11/1985 | Hoppe et al. | 283/83 |
| 4,587,413 | 5/1986 | Hoppe et al. | 235/492 |
| 4,617,216 | 10/1986 | Haghiri-Tehrani | 283/904 |

FOREIGN PATENT DOCUMENTS

| | | |
|---|---|---|
| 0116148 | 12/1983 | European Pat. Off. |
| 2439438 | 10/1978 | France |
| 2520541 | 1/1982 | France |
| 2548857 | 7/1983 | France |

Primary Examiner—Donald E. Czaja
Assistant Examiner—Lori Ann Cuervo
Attorney, Agent, or Firm—Robert T. Mayer

[57] ABSTRACT

The method and arrangement according to the invention utilize an adhesive tape (1) covered with a protective layer (2) provided with openings (4).

This tape is glued on a film (5) carrying contact metallizations (8) and integrated circuit chips (6) electrically connected to the said metallizations. The tape is glued on the film in such a manner that its openings (4) correspond to the positions of the integrated circuit chips (6). Subsequently, a coating varnish is applied by pulverization to the film and then the protective layer is removed with the varnish covering it. Vignettes slightly larger than the said openings are then cut in the film in such a manner that an adhesive ring is left around the integrated circuit chips. Each vignette is finally arranged in a recess ad hoc (12) of a card (10).

8 Claims, 10 Drawing Figures

METHOD OF MANUFACTURING AN ELECTRONIC IDENTIFICATION CARD

The invention relates to a method of manufacturing an electronic identification card, in which at least one integrated circuit chip is mounted on a film carrying conductor tracks, which is cut to form a vignette or section supporting the integrated circuit chip, this vignette or section then being arranged in a recess which is provided in a card and whose dimension corresponds to that of the vignette.

It also relates to an arrangement for manufacturing an identification card provided with a film supply spool, with an assembly for continuous mounting and electrically conducting semiconductor chips on the said film, with a machine for cutting vignettes in this film and with means for mounting these vignettes in identification cards.

The identification cards manufactured by the method and with the aid of the arrangement according to the invention are utilized in a variety of fields, in which the use of a secret code and/or of a memory is required, such as payment cards or bank credit cards, medical identification cards, identity cards, cards for admission to reserved rooms, cards for the use of public telephones.

The manufacturing method and the arrangement mentioned above are known from, for example, French Pat. No. 2,439,438. According to this document, a film is used, on which are arranged integrated circuit chips, in which then vignettes, for example of circular form, are cut, which are arranged in a hollow recess provided for this purpose in the card.

According to this technique, the coating of the chip for protecting it against chemical attacks gives rise to problems. Either it is not coated, as in FIG. 3 of the aforementioned document, or a specific frame is provided for limiting the spread of the coating material, as in the case of FIG. 8 of the same document, which requires supplementary manufacturing steps.

The invention has for its object to provide a method and an arrangement which permit of obtaining a coating of the chip in a very simple manner and without special precautions being taken.

For this purpose, the method according to the invention is particularly characterized in that an adhesive tape is glued on the film, this tape being covered with a protective layer and being provided with at least one hole passing through the tape and the protective layer and through which the integrated circuit chip is accessible, but which is smaller than the aforementioned recess provided in the card, in that, after the integrated circuit chip has been mounted and before it is arranged in the recess of the card, a protecting varnish is provided on the side of the chip over the whole accessible surface of the integrated circuit chip, of the film and of the tape in order to protect the chip, and in that then the protective layer is detached whilst removing with it the varnish covering it and exposing the adhesive tape.

The invention is consequently based on the idea of combining two effects by the use of the protective layer, the latter serving as a reservoir for the protecting varnish and also being used in a conventional manner as an anti-adhesive protecting the adhesive tape.

The method according to the invention may be used for manufacturing vignettes one by one, but it is advantageously utilized in mass-production, in which the carrier film and the adhesive tape with its protective layer are each formed from a tape of substantial length supplied from a spool. In this case, the adhesive tape is advantageously glued on the film before the integrated circuit chip is mounted, the cutting of the film for forming a vignette advantageously takes place after the protective layer has been detached, the cutting operation is effected by a punch and the same punch is used for arranging the vignette in the recess of the card, in which it is then fixed by means of the adhesive tape. In order to avoid that, at the instant at which the vignette is cut, the film and the tape, which are no longer provided with a protective layer, are disadvantageously glued on the anvil associated with the punching tool it is advantageous that, before the vignette is cut, the adhesive tape is provided with an auxiliary protective layer provided with holes having a dimension and a shape practically identical to those of the recess of the card whose position is chosen so that one of these holes corresponds to the recess in the card at the instant at which the cutting step is effected and the vignette is fixed.

For carrying out the method according to the invention, an arrangement provided with the aforementioned elements is moreover advantageously provided upstream of the assembly for mounting chips with a spool of adhesive tape covered with two protective layers, with a tool for providing holes in this tape, with a first means for detaching and receiving one of the protective layers, with pressing means for gluing the tape on the film, with calibration means for the relative positioning of the film and of the tape and downstream of the assembly for mounting chips with an apparatus for depositing varnish, with a second means for detaching and receiving the second protective layer, with a punching tool for cutting vignettes in the film and with a system for supplying cards associated with this punching tool cutting in a single operation a vignette in the film and arranging it in a card.

In order that the invention may be readily carried out, it will now be described more fully, by way of example, with reference to the accompanying drawing, in which.

Figure 1:
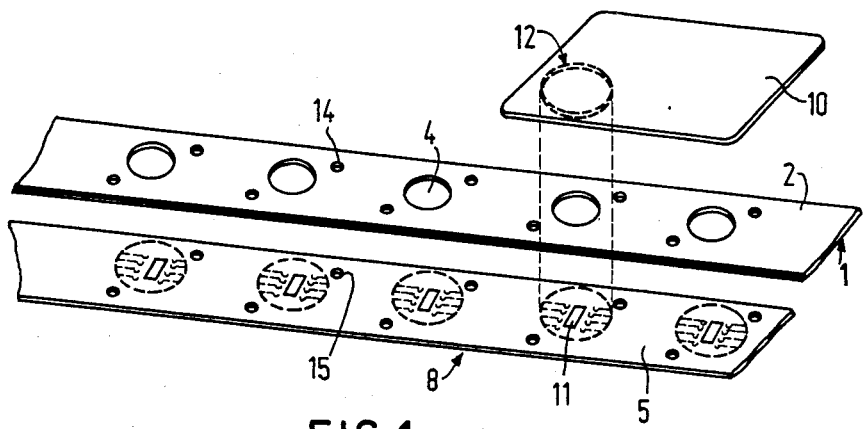
FIG. 1 is a perspective view of a film, a tape and a card used in accordance with the invention.

FIG. 1 shows a film 5, such as used in the prior art. This film is provided with printed conductors 8 (visible through the film) and sites 11 are formed therein for mounting an integrated circuit chip 6. This film is not necessarily provided with holes of the "cinematic film" type, but it has to comprise at least one calibration hole 15 for the mounting site of an integrated circuit.

Above the film 5, an adhesive tape 1 is shown provided with a protective layer of, for example, siliconated paper, which covers the gluing surface of the tape, but without adhering firmly to it. In the Figure, the layer 2 is located above the tape 1. This assembly of layer and tape has been provided beforehand with holes 4, the dimension of which will be explained hereinafter and with position calibration holes 14, which correspond to the holes 15 of the film, while the tape 1 is arranged opposite to the film 5 so that to each site 11 for mounting an integrated circuit 6 corresponds a hole 4. The state of the method shown in FIG. 1 corresponds to FIG. 2C, which will be explained below.

Although it does not yet exert any influence in this stage of the method, a card 10 provided with a recess 12, viewed in transparency, is shown in order to indicate the relative dimensions and positions of the different elements, which will be described hereinafter.

Figure 2A:
FIG. 2 shows in a sectional view along the longitudinal axis of the film the constituents used in the method according to the invention in different stages of the manufacture.

FIG. 2A shows in sectional view an adhesive tape 1 used for carrying out the invention and provided with two protective layers 2, 3. Such a tape is marketed, for example, under the designation "Y 9460" by the 3M Company.

Figure 2B:

In FIG. 2B, a hole 4 passing through the tape and the protective layers is formed in the tape.

Figure 4:
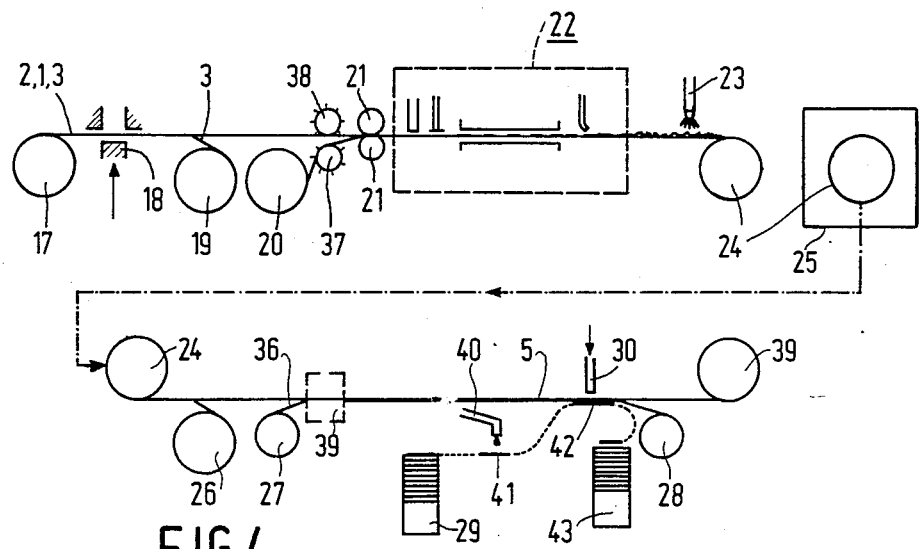
FIG. 4 shows an arrangement according to the invention for manufacturing cards.
Figure 2C:
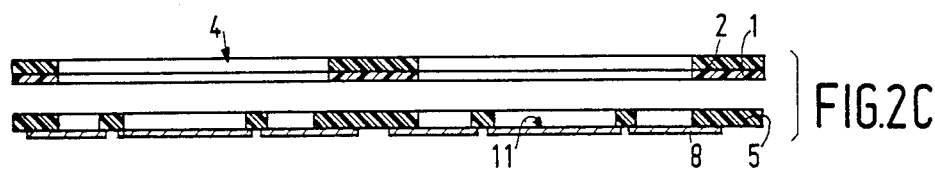

In FIG. 2C, the lower protective layer 3 has been removed and the tape has been taken to below a film 5 carrying conductors 8. The tape with the protective layers and the film are both advantageously supplied from a spool 17 (FIG. 4).

Figure 2D:
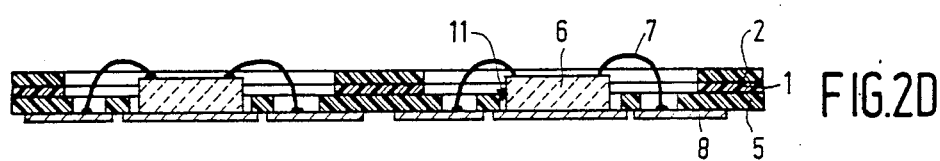

In FIG. 2D, the tape has first been glued to the film and then an integrated circuit chip 6 is mounted in a cavity 11 of the film and subsequently connected to the conductors 8 of this film by means of wires 7. Various methods of mounting and electrically connecting integrated circuits are known to those skilled in the art and are described in numerous publications, among which are the French Pat. No. 2,439,438 stated above, and, for example, the French Pat. No. 2,548,857, European Patent EP 0 116 148 and French Pat. No. 2,520,541.

FIG. 2D moreover shows that the chip is accessible through the hole of the tape 1, 2.

Figure 2E:
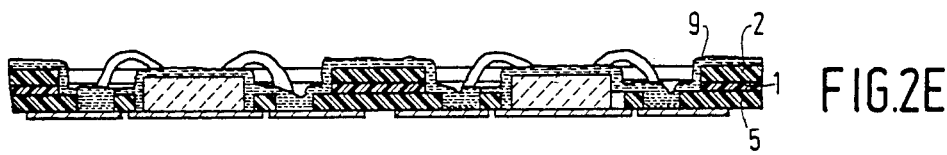

FIG. 2E shows the film and the tape covered with a varnish 9 over the whole surface of the tape and the surface of the film accessible through the hole of the tape. Of course the integrated circuit chip and its connecting wires are also covered with varnish so as to be protected from chemical attacks that could damage them in future.

The varnish used is advantageously a polymerizable varnish on the basis of silicone and has a viscosity adapted to its deposition by pulverization. For example, the varnish marketed under the designation "Electrofluge 200" by the Siceront KF Company may be used. It is advantageous to avoid the use of varnishes polymerizable by ultravilot radiation, because the latter could have undesirable effects on certain types of integrated circuits.

Figure 2F:

FIG. 2F shows the film and the tape after the protective layer 2 has been removed, which has the effect that the varnish that would cover it is also removed and that the adhesive tape is exposed. Thus, the varnish covering the chip and the film is accurately limited according to a perimeter which is exactly that of the hole in the tape 1.

Figure 2G:
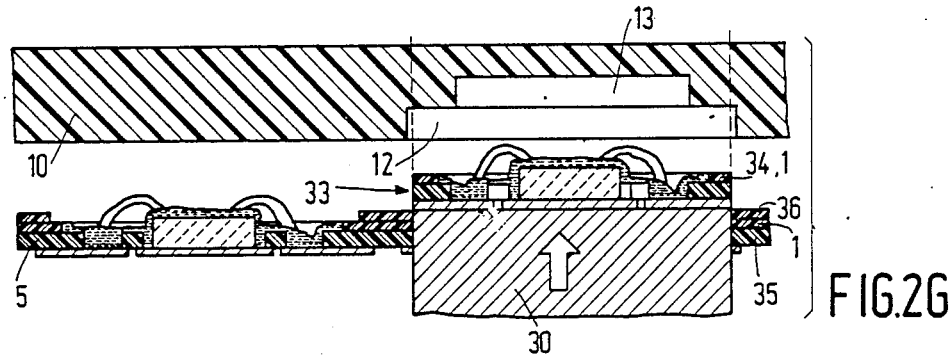

FIG. 2G shows a part of a card 10 that is arranged opposite to the film 5. A punching tool 30 is represented to show how, after the protective layer has been removed, this tool cuts a vignette or section 33 from the film which is received at the end of its course by the recess 12, 13 of the card 10.

The dimension of the vignette or section 33 cut by the punching tool 30 corresponds to that of the recess in the card, that is to say that it is cut as a function of the various manufacturing tolerances in such a manner that it fits as exactly as possible in the recess. The recess in the card has an external part 12 and a deeper central part 13, whose effect will be explained in greater detail with reference to FIG. 3.

This Figure moreover shows that the hole of the adhesive tape is smaller than the recess 12 provided in the card so that, after the vignette 33 has been cut by the punching tool 30, an adhesive ring 34 is left on the vignette, 33 this adhesive ring ensuring that the vignette is fixed in the card. This effect of the choice of the diameters in the case of, for example, circular holes is also indicated by vertical broken lines in FIG. 1.

FIG. 2G shows only the punching tool 30 just mentioned. It may be necessary to interpose between the film and the card an anvil corresponding to the tool 30 in order to hole in place the non-utilized film part 35. The suitable measures not shown can be easily taken by those skilled in the art. Moreover, the card itself may serve as an anvil, the part 35 of the film then being directly applied to the card; it is then necessary that the vignettes are spaced apart by a larger distance than in the Figure in order that one vignette at a time is opposite to the card.

In order to avoid that the non-utilized parts of the film adhere in an undesirable manner to the anvil or to the card, there is arranged between the stages shown in FIGS. 2F and 2G an auxiliary protective layer 36 of the same kind as the layers 2 and 3, which is provided with holes having a dimension and a shape practically identical to those of the recess 12 in the card 10 and whose position is chosen so that one of these holes corresponds to the recess in the card at the instant at which the vignette is cut and fixed in such a manner that not a single part of the layer 36 is cut and introduced into the recess 12.

Figure 3:
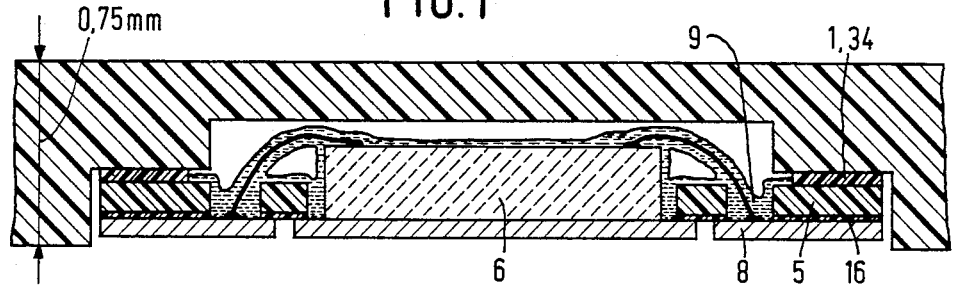
FIG. 3 is a sectional view at the level of the vignette of a finished card obtained by the method.

FIG. 3, which shows a sectional view of a finished card, permits of illustrating the relative thicknesses of the constituents. The scale of the thicknesses is about five times larger than the horizontal scale. The vertical arrow in the lefthand part of the Figure indicates a thickness of about 0.75 mm.

The different elements already described are designated therein by the same reference symbols: the film 5 and its metallizations 8, which are glued under the film by a glue layer 16, the chip 6 which, although it is mounted in a cavity of the film projects beyond the surface of the latter because the film has a thickness of about 150 $\mu$m (inclusive of the glue 16, but exclusive of the metallizations 8, whose thickness is about 70 $\mu$m), while the chip 6 has a thickness of about 300 $\mu$m. The adhesive 34 has a thickness of 50 $\mu$m and the recess in the card 10 has on the outer side a depth of 300 $\mu$m at the area at which the aforementioned adhesive ring 34 (FIG. 2) adheres and at the centre a depth of about 500 $\mu$m in order that the recess for the chip 6 is obtained. The varnish 9 must have a thickness of about 10 to 50 $\mu$m, that is to say that it must have a smaller thickness than the adhesive 34.

FIG. 4 shows an arrangement for carrying out the method described above. This arrangement comprises a spool 17 for supplying adhesive tape protected at its two surfaces by a protective layer, for example of siliconated paper. This tape with its protective layers is unwound in a punching tool 18, which forms therein at regular distances the holes described above. Subsequently, a spool 19 set into rotation exerts a pulling force on the first protective layer 3 in order to detach and receive it. Instead of being wound onto a spool, this layer could otherwise also fall directly into a bin. For example, an assembly of a roller and a capstan could then be provided for exerting a pulling force on the layer before it is released. A spool 2o supplies the film provided with metallizations and with sites for mounting therein an integrated circuit chip 6(FIGS. 1 and 3). This film follows at the end of the spool a path identical to that of the adhesive tape and they are glued on each other by a couple of pressure rollers 21. Before the films are applied one to the other, they are each guided by a wheel 37, 38 provided with bolts which are represented symbolically and are engaged in the perforations 15 of the film and 14 of the adhesive tape, respectively (see FIG. 1). These two wheels are rotatably coupled to each other in order to ensure that the perforations of the film and the tape correspond to each other (relative positioning).

At the end of the pressure rollers 21, the film covered by the adhesive tape with its protection layer is passed into an assembly 22 for mounting and electrically connecting integrated circuit ship. This apparatus is well known and does not form part of the inventon; therefore, the Figure shows only very diagrammatically and without individual reference numerals from the left to the right a tool for deposition of glue, a pipette for mounting chips, a passage furnace for drying the glue and a wire connecting tool thereof. As shown by the assembly of the arrangement, the chips are mounted on the upper side of the film, as is usual.

At the end of the mounting assembly 22, the film passes in front of a varnish pulverization nozzle 23. This nozzle is adjusted so that a thickness of about 30 μm of varnish is obtained. Alternatively, a ring could be formed in downward direciton in the film in order to cure it during its introduction into a bath of varnish. However, this method is less interesting because it requires that a protection of the back of the film should be provided beforehand, which makes the method more complicated.

After deposition of the varnish, the film is wound onto a spool 24 whilst interposing an intermediate spacer layer between the turns, whereupon the whole spool is arranged in a drying oven 25 for drying and/or polymerizing the varnish.

The spool is then taken out of the oven, as the case may be after having been stored, and another part of the apparatus which may be situated at quite a different place than the first part because the varnish spools can be transported without the risk of deterioration, is provided with a support for the said spool 24 and with a spool 26 for detaching and receiving the second protective layer. This spool operates in the same manner as the spool 19 described above and can be replaced like the latter by other equivalent systems. A system for supplying cards is provided, for example, with a card-loading magazine 29. A known system for handling cards (not shown) takes the cards from the loader 29 along the path indicated by dotted lines and presents a card opposite to a vignette in the position 42 (the relative position of card and vignette corresponds to that of FIG. 2G, but turned upside down). Finally, a punching tool 30 cuts the vignette into the film and at the end of the course places this vignette in the recess of the card, in which it is glued due to the adhesive ring (34.1, FIGS. 2G and 3).

There is disposed between the loader 29 and the position 42 an automatic metering tube 40, which serves to deposit in the recess 13 of the card which is of course present in the upper surface of the latter, a given quantity of, for example, 30 mg of a coating material, for example the products known under the commercial designations STYCAST 2850 FT and CATALYST 24 LV of the trademark Emerson-Cuming, mixed in the respective ratios 100/7. Finally, the handling system returns the card after the provision of the vignette and places it in a loader of finished products 43.

Whilst returning the card, the coating material, which was present in the lower part of the recess, flows over the integrated circuit chip, but is held in the recess because the latter is obturated by the vignette. Although the aforementioned product can polymerize in the environment, it is preferable to heat the finished cards at 60° C. for two hours in order to improve the mechanical properties of the coating material. Due to this product, the resistance to repeated bending of the cards is considerably improved because the varnish deposited beforehand is itself of a kind which remains flexible and does not have a mechanical effect during the bending of the cards.

The arrangement is moreover provided upstream of the apparatus for arranging the vignette with a spool 27 for supplying the aforementioned auxiliary protective layer 36 perforated beforehand and with calibration and pressure means 39 for positioning this layer and the film with respect to each other in the manner described above and applying the layer to the tape, these means being similar to the means 37, 38, 21. Downstream of the apparatus 29, 30 there is provided a spool 39 or an arbitrary device for receiving the remainder of the film and the tape provided with its protective layer 36. Now that the vignettes have been detached and mounted, it is not effective to detach the protective film 36, while the assembly of the remaining parts of the film, the tape and the layer is placed in the bin. However, if the protective layer 36 supplies from the spool 27 should be re-used, which is quite possible because it is not subjected to a single operation modifying it, a means 28 identical to the preceding means 19 or 26 will be provided.

Different variations or equivalents are possible without departing from the scope of the invention. For example, the integrated circuit plates could be arranged before the adhesive tape is positioned and glued. However, the thickness of the plate, which projects beyond the surface of the film, would prevent smooth rollers from being used at 21. Rollers would then be required provided with cavities at the area of the plates, these rollers in turn being connected to the wheels with bolts 37, 38 in order to ensure that the cavities corresponds to the film. Likewise, the assembly of the equipment may comprise several parallel films and the loader 29 may contain plates of large diameter comprising a plurality of elementary cards on which several films at a time together deposit one vignette per card. The card loader 29 may be replaced by a spool, onto which a support is wound, to which cards are fixed at regular distances.

What is claimed is:

1. A method of manufacturing an electronic identification card with at least one integrated circuit chip wherein the chip is mounted in a cavity in a carrier film having conductor tracks, said carrier film being cut to form a section which supports said chip, said section to be disposed in a recess provided in the card, the dimension of said recess corresponding to that of said section, said method including sticking a first side of an adhesive tape with adhesive on both sides to said section of said carrier film, said tape having a removable protective layer stuck to its second side, having formed therein an aperture in said tape and its protective layer which aperture is larger than said cavity but smaller than said recess, said aperture being disposed over said cavity to render said chip accessible through said aperture, applying varnish to said tape and said chip and removing said protective layer and the varnish covering it to expose the adhesive on the second side of said adhesive tape whereby said section can be pressed into and held in said recess by said second side of said adhesive tape.

2. A method according to claim 1, wherein the operation of cutting said carrier film to form said section is performed after the protective layer is removed and the operation is performed with a punch, said punch pushing the section into said recess.

3. A method according to claim 2, wherein the aperture in said tape and its protective layer is formed before said tape is stuck on said section.

4. A method according to claim 3, wherein the carrier film and the adhesive tape with its protective layer are each respectively supplied from a corresponding supply of such material of substantial length arranged on a spool.

5. A method as claimed in claim 4, wherein an auxiliary protective layer is applied to said adhesive tape before said section is cut from said carrier film, said auxiliary protective layer having an auxiliary aperture therein with a dimension and shape corresponding to said recess, said auxiliary aperture being disposed over said section so that said section is free of any auxiliary protective layer when it is cut from said carrier film.

6. A method as claimed in claim 5, wherein said adhesive tape is stuck on said carrier film before the integrated circuit chip is mounted on it.

7. A method as claimed in claim 6, wherein the varnish is a polymerizable varnish deposited by pulverization.

8. A method as claimed in claim 7, wherein the varnish is polymerized by winding the carrier film on a spool and placing the spool in a drying oven.

* * * * *